United States Patent [19]

Pankove

[11] Patent Number: 4,803,528

[45] Date of Patent: Feb. 7, 1989

[54] INSULATING FILM HAVING ELECTRICALLY CONDUCTING PORTIONS

[75] Inventor: Jacques I. Pankove, Princeton, N.J.

[73] Assignee: General Electric Company, Schenectady, N.Y.

[21] Appl. No.: 380,284

[22] Filed: May 20, 1982

Related U.S. Application Data

[62] Division of Ser. No. 172,757, Jul. 28, 1980, Pat. No. 4,339,285.

[51] Int. Cl.$^4$ .......................................... H01L 29/78
[52] U.S. Cl. ...................... 357/23.1; 357/59; 357/2
[58] Field of Search ............... 357/2, 59, 67 S, 65, 357/16, 23.1, 59 G, 59 K, 23.7, 23.15, 91

[56] References Cited

U.S. PATENT DOCUMENTS

| | | | |
|---|---|---|---|
| 3,585,088 | 6/1971 | Schwuttke et al. | 148/174 |
| 3,634,927 | 1/1972 | Neale et al. | 357/2 |
| 3,771,026 | 11/1973 | Asai et al. | 357/59 |
| 4,014,037 | 3/1977 | Matsushita et al. | 357/52 |
| 4,037,306 | 7/1977 | Gutteridge et al. | 357/49 |
| 4,048,649 | 9/1977 | Bohn | 357/43 |
| 4,059,461 | 11/1977 | Fan et al. | 148/1.5 |
| 4,062,034 | 12/1977 | Matsushita et al. | 357/16 |
| 4,063,967 | 12/1977 | Graul et al. | 148/1.5 |
| 4,084,986 | 4/1978 | Aoki et al. | 357/59 |
| 4,086,613 | 4/1978 | Biet et al. | 357/54 |
| 4,127,931 | 12/1978 | Shiba | 357/23.1 |
| 4,151,008 | 4/1979 | Kirkpatrick | 148/1.5 |
| 4,154,625 | 5/1979 | Golovchenko et al. | 148/1.5 |
| 4,193,183 | 3/1980 | Klein | 29/578 |
| 4,198,246 | 4/1980 | Wu | 357/91 |
| 4,214,918 | 7/1980 | Gat et al. | 357/91 |
| 4,229,502 | 10/1980 | Wu et al. | 428/446 |
| 4,234,358 | 11/1980 | Celler et al. | 357/91 |
| 4,240,843 | 12/1980 | Celler et al. | 148/1.5 |
| 4,240,843 | 12/1980 | Celler et al. | 148/1.5 |
| 4,243,433 | 1/1981 | Gibbons | 148/1.5 |
| 4,267,011 | 5/1981 | Shibata et al. | 357/59 |
| 4,269,636 | 5/1981 | Rivoli et al. | 357/55 |
| 4,272,880 | 6/1981 | Pashley | 29/571 |
| 4,295,924 | 10/1981 | Garnache et al. | 357/55 |
| 4,302,763 | 11/1981 | Ohuchi et al. | 357/16 |
| 4,309,224 | 1/1982 | Shibata | 357/59 |
| 4,409,609 | 10/1983 | Fukuda | 357/59 |

FOREIGN PATENT DOCUMENTS 1176889 1/1970 United Kingdom .

OTHER PUBLICATIONS

Structure of Crystallized Layers by Lasser Annealing of <100> and <111> Self–Implanted Silicon Samples, G. Foti et al., *Applied Physics*, 15, (1978), pp. 365–369.

Regrowth of Amorphous Films, S. S. Lau, *J. Vac. Sci. Technol.*, vol. 15, (1978), pp. 1656–1661.

Ion–Implantation Gettering at Elevated Temperatures, Beyer et al., *IBM Technical Disclosure Bulletin*, vol. 20, (1978), p. 3122.

By Laser Irradiation, C. Celler et al., *Applied Physics Letter*, 32(8), Apr. 15, 1978, pp. 464–466.

Laser–Programmable Variable–Value Resistor, B. K. Aggarwal, *IBM Technical Disclosure Bulletin*, vol. 21, No. 8, Jan. 1979, pp. 3271–3272.

Application of Laser Processing for Improved Oxides Grown from Polysilicon, G. Yaron, *IEDM Technical Digest*, International Electron Devices Meeting, Wash. D.C., Dec. 1979, pp. 220–223.

Writing SiO$_2$ on a Si Wafer, C-A. Chang, *IBM Technical Disclosure Bulletin*, vol. 20, No. 6, Nov. 1977, p. 2459.

Laser Annealing of Arsenic Implanted Silicon, J. Krynicki et al., *Physics Letters*, vol. 61A, No. 3, May 2, 1977, pp. 181–182.

A Comparative Study of Laser and Thermal Annealing of Boron–Implanted Silicon, J. Narayan et al., *Journal of Applied Physics*, vol. 49, No 7, Jul. 1978, pp. 3912–3917.

Laser Cold Processing Takes the Heat Off Semiconductors, R. A. Kaplan et al., *Electronics*, Feb. 28, 1980, pp. 137–142.

*Primary Examiner*—Andrew J. James
*Assistant Examiner*—Prenty Mark
*Attorney, Agent, or Firm*—Henry I. Steckler; James C. Davis, Jr.; Paul R. Webb, II

[57] ABSTRACT

A method for fabricating adjacent electrically conducting and insulating regions in a silicon film is described. A substantially insulating layer of oxygenated, N or P doped, non-single crystalline silicon film is first formed. The film is then selectively laser irradiated so as to form an irradiated portion which is substantially conducting.

1 Claim, 1 Drawing Sheet

INSULATING FILM HAVING ELECTRICALLY CONDUCTING PORTIONS

This is a division of application Ser. No. 172,757, filed July 28, 1980 which issued on July 13, 1982 as U.S. Pat. No. 4,339,285, METHOD FOR FABRICATING ADJACENT CONDUCTING AND INSULATING REGIONS IN A FILM BY LASER IRRADIATION.

BACKGROUND OF THE INVENTION

The present invention relates to laser irradiation of silicon films. More particularly, it relates to the laser irradiation of an oxygenated, doped, non-single crystalline silicon film.

Silicon films can be characterized by their crystallographic structure and by the type and concentration of impurity atoms they contain. The structures can be classified as crystalline, polycrystalline and amorphous, and the silicon films can be doped with oxygen, hydrogen or typical N or P type conductivity modifiers. A large number of combinations of crystal structure, impurity type and impurity concentration are therefore possible. By manipulating these combinations, it is possible to create a silicon film having electrical properties within a wide range of values. Generally, the conductivity of a silicon film increases as the degree of its crystallinity increases and as the doping concentration of N or P type conductivity modifiers increases. Compared to polycrystalline silicon films, amorphous silicon films tend to be more insulating and single crystalline films tend to be more conducting. As described herein, materials having resistivities greater than approximately $10^8$ ohm-centimeters will be characterized as insulating and materials having resistivities less than about $10^2$ ohm-centimeters will be characterized as conducting.

Polycrystalline silicon films doped with N or P type conductivity modifiers are electrically conductive and are conventionally used as gates, contacts and interconnections in integrated circuit devices. In U.S. Pat. No. 4,198,246, PULSED LASER IRRADIATION FOR REDUCING RESISTIVITY OF A DOPED POLYCRYSTALLINE SILICON FILM, issued Apr. 15, 1980 to C. P. Wu, and in U.S. Pat. No. 4,229,502 LOW RESISTIVITY POLYCRYSTALLINE SILICON FILM, issue Oct. 21, 1981 C. P. Wu et al, it is disclosed that the conductivity of N or P type polycrystalline silicon films can be further increased by subjecting them to thermal annealing or laser irradiation.

In contrast, oxygenated, polycrystalline silicon films are typically highly resistive and are conventionally used as insulating and passivating layers. Oxygenated polycrystalline silicon, hereinafter referred to as SIPOS, is an insulating material, although its conductivity can be increased if it is doped with an N or P type conductivity modifier. The resistivity of doped or undoped SIPOS can be further manipulated by varying its oxygen concentration, as is described in U.S. Pat. No. 4,014,037, SEMIICONDUCTOR DEVICE, issued Mar. 22, 1977 to T. Matsushita and in U.S. Pat. No. 4,086,613, SEMICONDUCTOR DEVICE HAVING A PASSIVATED SURFACE AND METHOD OF MANUFACTURING THE DEVICE, issued Apr. 25, 1978 to J. P.H. Biet et al. The resistivity of pure (nonoxygenated) polycrystalline silicon is approximately $3 \times 10^6$ ohm-centimeters, whereas SIPOS containing approximately 20 atomic percent oxygen has a resistivity of approximately $10^{11}$ ohm-centimeters. Oxygenated, amorphous silicon is also substantially insulating, typically having a resistivity greater than $10^8$ ohm-centimeters.

SUMMARY OF THE INVENTION

A method is disclosed for fabricating adjacent electrically conducting and insulating regions in a silicon film. Initially, a substantially insulating layer of oxygenated, N or P doped, non-single crystalline silicon film is formed. This film is then selectively laser irradiated so as to form an irradiated portion which is substantially conducting.

DETAILED DESCRIPTION

Figure 1:
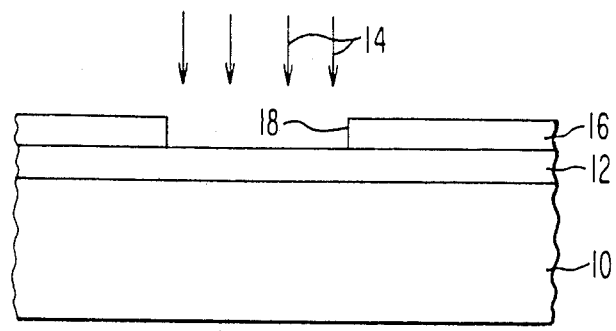
FIGS. 1 and 2 illustrated the process steps in a preferred embodiment of the present invention.

In the preferred embodiment, as illustrated in FIG. 1, a layer of oxygenated, N or P doped, non-single crystalline silicon film 12 is formed on a substrate 10. The substrate 10 is not essential to the invention, although it provides a carrier on which to form the silicon film 12 and it may be used in conjunction with the silicon film 12 to create, for example, a semiconductor device. The substrate 10 can be a conductor, semiconductor, semi-insulator or insulator, and it can be of any crystalline or non-crystalline structure. In one example, the substrate 10 is single crystalline silicon, appropriately doped to create a diode, transistor or thyristor.

The material of the silicon film 12 is oxygenated, N or P type non-single crystalline silicon. It can be either N or P type SIPOS, or oxygenated, N or P type amorphous silicon. It is essential to the invention that the film 12 be doped with both oxygen and an N or P type conductivity modifier. A film so described will be substantially insulating; it will have a resistivity greater than $10^8$ ohm-centimeters. This insulating silicon film 12 can be formed by conventional methods, such as by the thermal decomposition of silane in an atmosphere containing both a source of oxygen and the appropriate N or P type dopant. An appropriate thickness for the film 12 would be about 0.1–10µ.

The silicon film layer 12 is then selectively irradiated by laser irradiation 14. A laser pulse from a Nd-YAG laser operated at a level of 0.45 joules/cm$^2$ has produced the results described herein. The wavelength of the radiation was 0.53 micrometers and the pulse duration was 90 nanoseconds. Although these parameters have been experimentally verified, it should be recognized that the invention is not limited to a Nd-YAG laser or these operating parameters. Other lasers, such as Nd-glass, as well as other wavelengths and combinations of power level and pulse duration should be expected to yield similar results. Additionally, multiple laser pulses can be used. For example, a multiple laser pulse might be used if one desires to monitor film resistivity changes between pulses.

The selectivity of the radiation 14 can be regulated, for example, by optically focusing the radiation 14, or by using an apertured mask 16 disposed on the silicon film 12. The mask 16 is made of a material which is opaque to the radiation 14 and it includes an aperture 18 corresponding to that portion of the insulating film 12 which will be made conductive. Any metal, for example, is a suitable mask 16 material.

Figure 2:
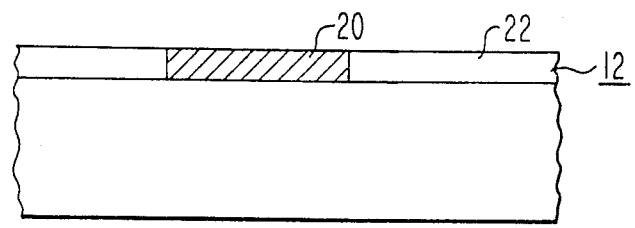

Following the irradiation, the mask 16 is removed, as illustrated in FIG. 2. That portion of the film 12 which was irradiated 20 has now been rendered substantially conductive. In the cited example, the original oxygenated, doped, non-single crystalline silicon film 12 had a resistivity on the order of approximately $10^{11}$ ohm-centimeters. As a result of the described laser pulse, the irradiated portion had a resistivity of 2.4 ohm-centimeters, a drop in resistivity of approximately 11 orders of magnitude. The result is an electrically conducting film 20 adjacent to an electrically insulating film 22; a structure which can serve a variety of functions in electronic devices.

Figure 3:
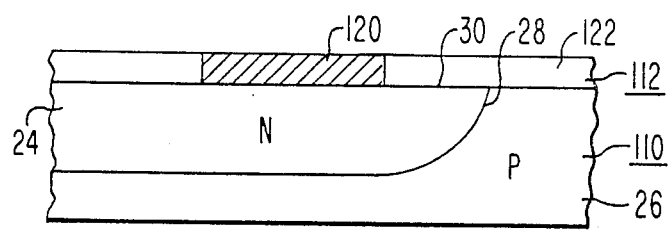
FIG. 3 illustrates an electrode/passivation layer structure fabricated by the present invention.
Figure 4:
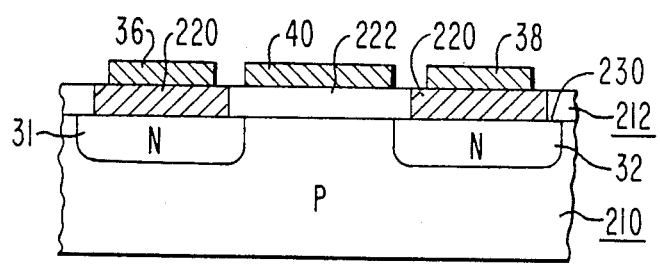
FIG. 4 illustrates an electrode/gate oxide structure fabricated by the present invention.
Figure 5:
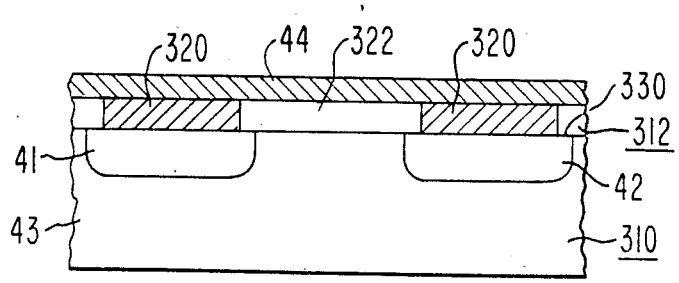
FIG. 5 illustrates an interconnection structure fabricated by the present invention.

FIGS. 3, 4 and 5 illustrate three embodiments of the present invention in semiconductor devices. FIG. 3 illustrates the invention being used as an electrode/passivating layer. In this embodiment, a semiconductor substrate 110 is provided, the substrate including regions of first and second conductivity type, 24 and 26 respectively. A PN junction 28 separates the first and second semiconductor regions 24 and 26, the PN junction 28 terminating at a substrate surface 30. A silicon film 112, similar to the previously described silicon film 12, is disposed on the substrate surface 30. A conducting portion 120 of the film 112 overlies the first semiconductor region 24 and a non-irradiated portion 122 overlies the PN junction 28 at the surface 30. This embodiment is particularly suitable for use in a semiconductor power device in which the PN junction 28 supports a relatively high voltage.

In FIG. 4, the present invention is embodied in the gate structure of an insulated gate field effect transistor (IGFET). In this exemplary embodiment, a semiconductor substrate 210, of first conductivity type, is provided. The substrate 210 includes a surface 230, and source and drain regions, 31 and 32 respectively, of second conductivity type, extend into the substrate from the surface 230. A silion film 212 similar to the previously described silicon film 12 is disposed on the semiconductor surface 230. The film 212 is selectively irradiated such that conducting portions 220 are formed over the source and drain regions 31 and 32. That portion of the film 212 between the conducting portions 220 and overlying the substrate between the source and drain regions 31 and 32 is deliberately not irradiated, so that it remains an insulating portion 222.

Electrical contacts, which may be of conventional metallization, are disposed on the silicon film 212. A source electrode 36 overlies the conducting portion 220 overlying the source region 31, a drain electrode 38 overlies the conducting portion 220 which overlies the drain region 32 and a gate electrode 40 overlies the insulating portion 222 which overlies that portion of the substrate 210 between the source and drain regions. In this embodiment, the silicon film 212 simultaneously insulates the gate electrode 40 from the substrate and connects the source and drain electrodes 36 and 38 to the respective semiconductor regions 31 and 32. Furthermore, it should be recognized that this embodiment, described with reference to a planar FET is also applicable to nonplanar field effect devices such as vertical, double-diffused MOSFETs (VDMOS) and vertical, grooved MOSFETS (VMOS).

In FIG. 5, the present invention is embodied as an interconnection. In this embodiment, a substrate 310 is provided having a surface 330 and including first and second regions 41 and 42 spaced at surface 330 by a third region 43. The substrate 310 might be, for example, a semiconductor, and the first, second and third regions, 41, 42 and 43, might be internal semiconductor regions doped with N or P type conductivity modifiers. A silicon film 312, similar to the previous described film 12, is disposed on the surface 330 and is irradiated so as to form conducting portions 320 over the first and second regions 41 and 42. That portion of the film 312 disposed over the third region 43 remains an insulating portion 322. An electrically conducting film 44 of any electrically conductive material overlies the silicon film 312 so as to electrically connect the conducting portions 320 which overlie the first and second regions 41 and 42. The conducting film 44 is insulated from the third region 43 by the insulating portion 322 of the silicon film 312 between the conducting portions 320.

It should be recognized that the illustration in FIG. 5 represents an exemplary configuration and that other interconnection embodiments of the present invention are also possible. In FIG. 5, the first, second and third regions 41, 42 and 43 are illustrated as internal to the substrate 310, however, they may be external as well. For example, spaced first and second regions might be disposed on the external surface 330 and the described interconnection structure might be disposed on the surface 330 to bridge these external first and second regions. In this example, the first and second regions might be thin conductor film lines on the surface 330 of an insulating substrate 310. This is commonly referred to as a crossover structure in the thin film and semiconductor art.

Furthermore, it should be recognized that additional interconnection structures, as well as alternative electrode/passivation and insulated gate structures are possible within the scope of the present invention. The invention is generally applicable to structures in which it is desired to generate a film which incorporates selective conducting and insulating areas.

What is claimed is:

1. A selectively electrically conducting structure comprising:
   a layer of oxygenated, doped, non-single crystalline silicon film;
   a semiconductor substrate having a surface, the substrate including spaced source and drain regions of an insulated gate field effect device at said surface;
   the layer of oxygenated, doped, non-single crystalline silicon film is disposed on said surface and selectively laser irradiated so as to form substantially conducting irradiated portions disposed over the source and drain regions, and a substantially insulating non-irradiated portion disposed on the substrate surface between the source and drain regions;
   source and drain electrodes disposed respectively on the conducting portions of the silicon film disposed on the source and drain regions; and
   a gate electrode disposed over the insulating portion of the silicon film so as to form an insulated gate.

* * * * *